United States Patent [19]

Enomoto

[11] Patent Number: 4,752,499

[45] Date of Patent: Jun. 21, 1988

[54] ADHESIVE FOR ELECTROLESS PLATING AND METHOD OF PREPARATION OF CIRCUIT BOARD USING THIS ADHESIVE

[75] Inventor: Ryo Enomoto, Oogaki, Japan

[73] Assignee: Ibiden Co. Ltd., Oogaki, Japan

[21] Appl. No.: 860,886

[22] Filed: May 8, 1986

[30] Foreign Application Priority Data

May 16, 1985 [JP] Japan .................................. 60-102632
Jun. 3, 1985 [JP] Japan .................................. 60-118898

[51] Int. Cl.⁴ .......................... B05D 5/12; B05D 3/04
[52] U.S. Cl. ........................................ 427/98; 427/306
[58] Field of Search .................................. 427/306, 98

[56] References Cited

U.S. PATENT DOCUMENTS

| | | |
|---|---|---|
| 3,672,937 | 6/1972 | Kallrath et al. ........................ 427/306 |
| 3,686,017 | 8/1972 | Menikheim et al. ................. 427/304 |
| 4,448,836 | 5/1984 | Gätzschmann et al. ............ 427/307 |
| 4,457,952 | 7/1984 | Kawamoto ........................... 427/306 |
| 4,552,626 | 11/1985 | Stevenson ............................. 204/20 |
| 4,643,798 | 2/1987 | Takada et al. ....................... 427/307 |

FOREIGN PATENT DOCUMENTS 61442 5/1976 Japan .
61443 5/1976 Japan .

Primary Examiner—John H. Newsome
Assistant Examiner—M. L. Padgett
Attorney, Agent, or Firm—Balogh, Osann, Kramer, Dvorak, Genova & Traub

[57] ABSTRACT

An adhesive for electroless plating is composed of at least one kind of fine powders selected from either a cured heat resistant resin or an inorganic material and easily soluble in a predetermined solution and a heat resistant resin solution sparingly soluble in the predetermined solution by curing treatment. The adhesive for electroless plating in which the above fine powders are dispersed in the above uncured heat resistant resin solution, is coated on a circuit board, dried and cured to form an adhesive layer. When the above predetermined solution contacts with the surface of the adhesive layer, its surface is roughed to be formed a plating film having an excellent adhesiveness by electroless plating.

6 Claims, 1 Drawing Sheet

FIG. I (A) 
FIG. I (B) 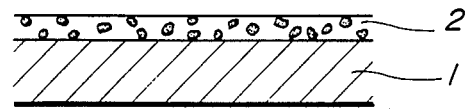
FIG. I (C) 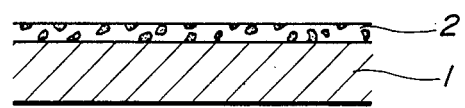
FIG. I (D) 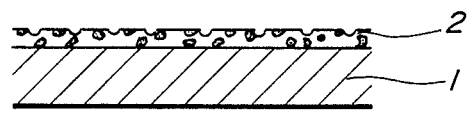
FIG. I (E) 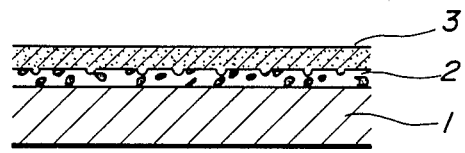

ADHESIVE FOR ELECTROLESS PLATING AND METHOD OF PREPARATION OF CIRCUIT BOARD USING THIS ADHESIVE

BACKGROUND OF THE INVENTION

1. Field of the Invention:

This invention relates to an adhesive for electroless plating used for a circuit board and a method of preparation of a circuit board using this adhesive and, more particularly, to an adhesive for electroless plating, which is excellent in heat resistance, electric characteristics and adhesiveness between a substrate and an electroless plating film, and a method of preparation of a circuit board using this adhesive.

2. Description of the Prior Art:

Recently, miniaturization and speeding up of electronic device have been developed with the progress of electronic industries. Accordingly, in the circuit board wherein a printed circuit board and a LSI are practically mounted, it has been required a high density and a high reliability due to fine pattern.

Heretofore, as a method for forming a conductor circuit on a printed circuit board, an etched foil method for forming a conductor circuit by photoetching after laminating copper foil on a substrate is widely used. According to this method, a conductor circuit excellent in the adhesiveness to the substrate can be formed. However, this method has such defect that a fine pattern having a high accuracy with etching can not be obtained due to a large thickness of the copper foil. Further, the preparing steps are so complicated that good efficiency can not be obtained.

Heretofore, as substrate materials used for said circuit board, ceramic materials having good reliability, stability of sizing, heat diffusion or the like are widely used. As a method for forming a conductor circuit on a circuit board made from said ceramic material, it is generally applied a method in which a thick film conductor paste such as paste of silver palladium series is printed by screen printing.

However, the conductor formed by said thick film paste is high in sheet resistance, and great in transmission loss of high frequency. Further, it is within the limits of 0.2 mm in width in fine line characteristics practically and is also inferior in soldering and bonding. Furthermore, it is necessary to pay attention to silver migration.

As a method for forming such conductor which is possible to dissolve the above defect, a method for forming a conductor on a substrate by electroless plating has been recently proposed. However, the conductor formed by electroless plating is inferior in adhesiveness to substrate materials. Accordingly, various researches for increasing such adhesiveness has been studied.

For instance, following methods described in the collection of previous copy of lecture in the 11th ISHM JAPAN technical lecture meeting, pages 9 to 17, distributed on Apr. 11, 1985, are adopted:

A method of electroless plating in which a surface of ceramic substrate is previously chemically etched to be roughed, thereby displaying anchor effect, and An additive method in which an adhesive containing a synthetic rubber of diene series is coated on a surface of substrate to form an adhesive layer and electroless plating is carried out to form a conductor after roughing the surface of the adhesive layer.

However, these methods described in the collection of previous copy of lecture are considerably difficult to rough the whole surface of the ceramic substrate by uniform etching and adhesive strength of the conductor due to the electroless plating is apt to disperse, thereby being scarce of reliability. Further, since the adhesive generally used in the latter method contains the synthetic rubber, the latter method has such defects as to cause a large decrease of adhesive strength at high temperature and a blister of electroless plating film at soldering due to low heat resistance and insufficient electric characteristics such as surface resistance. Accordingly, the use of such adhesive is considerably restricted.

An invention regarding "resin composition for printed circuit board" is disclosed in the patent laid open No. Sho 53 (1978)-140344 Gazette, the summary of the invention as described in the claim is as follows;

"A resin composition for printed circuit board used for preparing a printed circuit board characterized in that said resin composition consists of a component (A) capable of being soluble by etching to form a continuous phase and a component (B) of a thermosetting resin, which is not soluble in phase of the component (A), and forms spherical particles having 0.5 to 15 μm in diameter without being etched to disperse in the continuous phase of the component (A), the component (B) consists of a resin having 20 to 85 volume % to the sum of the components (A) and (B), and is coated on a substrate surface to be formed at least a part of a conductor contacting directly with a substrate by electroless plating".

According to the invention described in said gazette, since the adhesive layer obtained by etching and roughing of the resin composition causes an uneveness having about 20 μm in depth as described in page 3 on the left-hand column, the conductor formed on this adhesive layer is difficult to obtain fine patterns and insulation between the patterns is liable to be degraded. Further, it is not preferable to attach parts to such conductor.

As described the above, heretofore it is not well-known an adhesive, which possesses a heat resistance, electric characteristics, and a adhesiveness between substrate and electroless plating film and is possible to practise the electroless plating comparatively easily, and a method of preparation of a circuit board using this adhesive.

SUMMARY OF THE INVENTION

It is an object of the present invention to provide an adhesive for electroless plating which avoids all of the defects of the conventional adhesive for electroless plating, possesses an excellent heat resistance, electric characteristics and adhesiveness to an electroless plating film, and is possible to carry out comparatively easily and a method of preparation of a circuit board using this adhesive. This adhesive is composed of at least one kind of fine powders selected from either a cured heat resistant resin or an inorganic material and lightly soluble in a predetermined solution, and an uncured heat resistant resin solution sparingly soluble in said predetermined solution by curing treatment. When the adhesive for electroless plating wherein said fine powders are dispersed in said uncured heat resistant resin solution is allowed to contact with said predetermined solution on a surface of the adhesive layer formed by causing the adhesive coated on a circuit board to dry and cure, said surface is roughed, whereby a plating film having an excellent adhesiveness can be formed by electroless plating.

BRIEF DESCRIPTION OF THE DRAWINGS

FIG. 1 (A) is a longitudinal cross-sectional view of a substrate;

FIG. 1 (B) is a longitudinal cross-sectional view of the substrate wherein an adhesive layer is formed;

FIG. 1 (C) is a longitudinal cross-sectional view of the substrate showing a state wherein fine powders are exposed on a surface of the adhesive layer of FIG. 1 (B);

FIG. 1 (D) is a longitudinal cross-sectional view of the substrate showing a roughed state of a surface of the adhesive layer;

FIG. 1 (E) is a longitudinal cross-sectional view of a circuit board subjected to electroless plating.

DETAILED DESCRIPTION OF THE INVENTION

Figure 2:
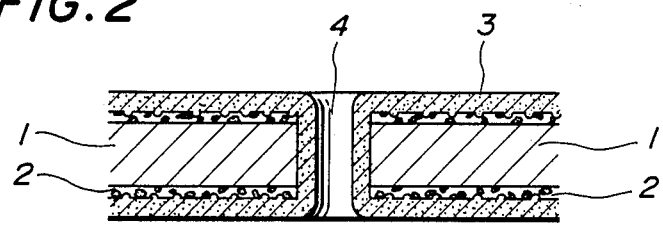
FIG. 2 is a longitudinal cross-sectional view of the double-sided circuit board of the through holes.

The adhesive for electroless plating used for a circuit board of the present invention is composed of at least one kind of fine powders selected from either a cured heat resistant resin or an inorganic material and is easily soluble in a predetermined solution and an uncured heat resistant resin solution sparingly soluble in said predetermined solution by curing treatment, said fine powders being dispersed in said uncured heat resistant resin solution.

In said adhesive, fine powders consisting of lightly soluble materials in the predetermined solution are dispersed in heat resistant resin solution. When this adhesive is coated on the substrate, dryed and cured, an adhesive layer having a state wherein said fine powders are uniformly dispersed in heat resistant resin for forming matrix (hereinafter, referred to it as "matrix heat resistant resin") is formed. This is because the fine powders dispersed on the surface of the adhesive layer are chiefly dissolved to be removed by the treatment of said adhesive layer with the predetermined solution due to the solubility difference between said fine powders and matrix heat resistant resin with respect to said predetermined solution, whereby a clear anchor is formed and the surface of the adhesive layer can be uniformly roughed. As a result, a high adhesive strength of the substrate and the electroless plating film and its reliability can be obtained.

Various kinds of fine powders can be used for the present invention according to the kinds of said predetermined solution. For instance, when oxidizing agents consisting of aqueous solution such as chromic acid, chromate, permanganate, ozone or the like are used, fine powders of heat resistant resin can be used. On the other hand, when strong acidic solution such as hydrochloric acid, sulfuric acid, nitric acid, hydrofluoric acid, or these mixture or strong alkali solution such as sodium hydroxide are used, inorganic fine particles can be used.

The fine powders of heat resistant resin are preferable to be previously cured heat resistant resin ones. This is the reason why in a state that said heat resistant resin fine powders are not cured, when said powders are added into a heat resistant resin solution or a solution in which this resin is dissolved by using a solvent, these fine powders are dissolved in the solution, and an adhesive layer is formed in an eutectic state of a matrix heat resistant resin and heat resistant resin fine powders even if the adhesive is coated on a substrate dried and cured, whereby the surface of the adhesive layer can not selectively dissolve due to nearly a uniform dissolution of the adhesive layer to the oxidizing agent and a clear anchor can not be formed. On the other hand, when said heat resistant resin fine powders are previously cured, an adhesive wherein the heat resistant resin fine powders are uniformly dispersed in the matrix heat resistant resin solution can be obtained because said heat resistant resin fine powders become to be sparingly soluble in the solvent for dissolving the resin or heat resistant resin solution. As a result, a clear and uniform anchor can be formed as described the above.

The thermosetting resin component (B) which forms spherical particles of the compositions according to the invention described in said patent laid-open No. Sho 53(1978)-140344 is not etched, while the heat resistant resin fine powders dispersed in the adhesive of the present invention are soluble in the oxidizing agent. In other words, the invention described in said gazette is obviously different from the present invention in the point that the former is not etched.

The materials of the heat resistant resin fine powders according to the present invention are excellent in heat resistance and electric insulation and stable to the normal chemicals. Further, it is possible not only to make it sparingly soluble in the heat resistant resin solution or a solvent for dissolving this resin by the previous curing treatment, but also to use the resin having a characteristic capable of being dissolved by the oxidizing agents such as chromic acid. Especially, as the above resin, at least one kind of resin selected from one of epoxy resin, polyester resin, and bis-maleic-imido-triazin resin is preferablly used. Among these resins, the epoxy resin is the most excellent and most suited in characteristics. As the curing method, a heating method, a method by adding a catalyst or the like can be used. Especially, the curing method by heating is the most practical one. As the oxidizing agents, for instance, there are chromic acid, chromate, permanganate, ozone or the like, especially an aqueous mixed acid of chromic acid and sulfuric acid can be used advantageously.

As the materials of said inorganic fine particles, such materials which are soluble in strong acid solution such as hydrochloric acid, sulfuric acid, nitric acid, hydrofluoric acid or the mixture thereof, or strong alkali solution such as sodium hydroxide, and have the heat resistance, electric insulation and stability to chemicals other than said strong acids and strong alkalis, can be preferably used. These, for instance, include silica, titanium oxide, zirconia, zinc oxide, glass or the like. Especially, for instance, inorganic fine particles chiefly containing $SiO_2$ such as crystal silica, fused silica, mulite, silimanite, glass of silica series or the like can be easily dissolved in the hydrofluoric acid, and further these particles are excellent in characteristics.

A particle size of said fine powders is preferable to be less than 10 $\mu m$ in average particle size, especially, preferably less than 5 $\mu m$. If the average particle size is larger than 10 $\mu m$, the density of the anchor formed by removing with dissolution decreases and is apt to be ununiform, thereby decreasing the adhesive strength and reliability thereof. Further, the fine pattern of the conductor can not be obtained due to the increase of the unevenness of the adhesive layer surface and it is not desirable to attach the parts on the conductor.

Further, among fine powders describe the above, the fine powders of the heat resistant resin can be obtained by various processes such as to pulverize the heat resistant resin by using a jet mill or a freezing crusher after thermosetting, or to spray dry the heat resistant resin solution before curing treatment for directly pulverizing it.

As the matrix heat resistant resin wherein the fine powders according to the present invention are dispersed, any resin which is excellent in heat resistance, electric insulation, chemical stability, and adhesiveness, and sparingly soluble in the predetermined solution by curing treatment, can be used. Especially, at least one kind of resin selected from epoxy resin, epoxy modified polyimido resin, polyimido resin, phenol resin and triazin resin is used preferably. A resin provided with the photo-sensitivity to the above resins may be used.

Since the fine powders are remarkably different from the matrix heat resistant resin after curing treatment in solubility in the predetermined solution, when the fine powders dispersed on the surface of said adhesive layer are dissolved using the predetermined solution, the sparingly soluble matrix heat resistant resin is scarcely dissolved in said predetermined solution and remains as the substrate, thereby forming a clear anchor on the surface of the adhesive layer. Further, even if these are the same kinds of heat resistant resins, for instance, epoxy resin which is easily soluble in the oxidizing agents as the heat resistant resin fine powders and epoxy resin which is comparatively sparingly soluble in the oxidizing agents as said matrix heat resistant resin may be used in combination.

As the heat resistant resin solution wherein said fine powders of the present invention are dispersed, the heat resistant resin solution which is not contained the solvent can be used as it is. However, since the heat resistant resin solution wherein the heat resistant resin is dissolved in the solvent is possible to be a low viscosity, it is easy to disperse the fine powders uniformly and to coat the powders on the substrate. As the solvents for dissolving said heat resistant resin, the normal solvents such as methyl ethyl ketone, methyl cellusolve, ethyl cellusolve, butyl carbitol, butyl cellulose, tetralin, dimethylformamide, N-methyl pyrolidon can be used. Further, for instance, a filler comprising inorganic fine powders such as silica, alumina, titanium oxide, zirconia, beryllia, silicon nitride, boron nitride may be mixed properly into said heat resistant resin solution to be matrix.

The amount of mixing of the fine powders to said matrix heat resistant resin is preferable within the range of 5 to 350 weight parts with respect to 100 weight parts of matrix heat resistant resin solids. Especially, the range of 20 to 200 weight parts is preferable because it is possible to obtain a high adhesive strength of the substrate and the electroless plating film. This is the reason why when the mixing amount of the heat resistant resin fine powders is less than 5 weight parts, the anchor density formed by dissolution decreases and a sufficient adhesive strength of the substrate and the electroless plating film can not be obtained, while when it is more than 350 weight parts, the whole adhesive layer is almost dissolved whereby a clear anchor is not formed.

Then, a method of preparation of a circuit board used the adhesive of the present invention will be described as follows.

According to the present invention, the adhesive in which the fine powders are dispersed in the heat resistant resin solution to be matrix is coated on the substrate. As this method, various kinds of means such as means of roller coating, dip coating, spray coating, spinner coating, curtain coating, screen printing can be applied and the adhesive layer is formed by coating, drying and curing. The thickness of said adhesive layer is usually within the range of 2 to 40 $\mu$m. However, when the adhesive layer is used together with the object of the interlayer insulating film of metal substate and multi-layer circuit board it can be coated more thickly.

As the substrate of the present invention, for instance, a plastic substrate, a ceramic substrate, a metal substrate, a film substrate or the like can be used. More specifically, a glass-epoxy substrate, a glass polyimido substrate, an alumina substrate, a low temperature calcined ceramic substrate, an aluminum nitride substrate, an aluminum substrate, an iron substrate, a polyimido film substrate or the like can be used. By using these substrates, single-sided circuit boad, both-sided through hole circuit board, multi-layer circuit board such as Cu/polyimido multi-layer circuit board can be prepared. Further, said adhesive itself is formed to be a plate shape or a film shape whereby it is possible to make it a substrate having adhesiveness which is possible to subject to the electroless plating.

Then, at least one part of the fine powders dispersed on the surface of said adhesive layer is dissolved to be removed using the predetermined solution. As this method, such means as to immerse the substrate formed the adhesive layer thereon using said predetermined solution in said predetermined solutin or to spray the solution on the substrate can be carried out. As the result, the surface of the adhesive layer is roughed. Further, in order to carry out the dissolution and removement of the fine powders effectively, it is advantageous to remove the part of the surface of said adhesive layer lightly with the aid of abrasive means such as polishing or liquid honing using fine powder abrasive.

According to the present invention, the electroless plating is subjected to the substrate made the surface of the adhesive layer rough. As the electroless plating, electroless copper plating, electroless nickel plating, electroless tin plating, electroless gold plating, electroless silver plating or the like can be included. Especially, at least one kind electroless plating selected from the electroless copper plating, electroless nickel plating, and electroless gold plating is preferable. Further, it is possible to carry out another different electroless plating or electric plating and to coat a soldering in addition to said electroless plating.

The circuit board obtained by the present invention can be formed a conductor circuit by the various prior methods of printed circuit board. For instance, a method of etching a circuit after subjected the electroless plating to the substrate, a method of forming a circuit directly at the time of electroless plating or the like can be applied.

The examples of the present invention will now be described as follows.

EXAMPLE 1

(1) Epoxy resin (Mitsui Petrochemical Industries Co., Ltd's TA-1800) was dryed in a hot blast dryer at 160° for 1 hour and then dried at 180° C. for 4 hours to cure. The cured epoxy resin was grinded roughly and then pulverized with a supersonic jet crusher while causing it to freeze with liquid nitrogen. Further, the resultant epoxy resin was classified with a wind classifier to form epoxy resin fine powders of 1.6 μm in average particle size.

(2) To 100 weight parts (solid parts) of epoxy modified polyimido resin (Mitsui Petrochemical Industries Co., Ltd's TA-160) dissolved in dimethyl formamide solvent was mixed 120 weight parts of the epoxy resin fine powders. The mixture was adjusted to the viscosity 120 cps with a homo-disper dispersant while adding the dimethyl formamide solvent, and then kneaded it with 3 rollers to obtain the adhesive.

(3) After coating this adhesive on a glass-polyimido substrate (Toshiba Chemical Products Co., Ltd's, size 100×100×1.5 mm) which was not pasted a copper foil with a roller coater, it was dried to cure at 160° for 1 hour and then at 200° C. for 6 hours. Thus, the adhesive layer having 7 to 9 μm in thickness was formed.

(4) A substrate wherein the surface of the adhesive layer was lightly abraded with a rotary brush grinder using #1000 alumina fine powder abrasive material was immersed into the oxidizing agent consisting of 800g/l chromic acid ($CrO_3$) aqueous solution at 60° C. for 2 minutes to rough the surface of the adhesive layer, and then immersed into a neutralization solution. (Shipley Far East Company Inc.'s PM 950) and washed with water.

(5) A palladium catalyst (Shipley Far East Company Inc.'s Cataposit 44) was provided on the substrate made the surface of the adhesive layer rough to activate the surface of the adhesive layer. Then, the resultant substrate was immersed into electroless copper plating liquid for additive method showing the following composition for 3 hours to be subjected the electroless copper plating having 7 μm in thickness of plating film thereto.

cupric sulfate ($CuSO_4 5H_2O$): 0.06 mol/l
formalin (37%): 0.30 mol/l
caustic soda (NaOH): 0.35 mol/l
EDTA: 0.12 mol/l
additive: a little
plating temperature: 70–72° C., PH:12.4

The circuit board thus prepared was further subjected to the electric plating in the cupric sulfate plating bath to make the thickness of copper plating to 35 μm. The adhesive strength of the substrate and copper plating film was measured by a method of JIS-C-6481. The result was 1.6kg/cm in peel strength. Further, the change of the surface resistance of the adhesive layer after immersing into the boiling water at 100° C. for 2 hours was $3 \times 10^{12}$ Ω.cm with respect to the initial value $7 \times 10^{13}$ Ω.cm. Further, any change was not observed after a heat resistant test wherein the surface of the circuit board was allowed to adhere to a hot plate maintained its surface temperature at 300 20 C. to heat for 10 minutes.

COMPARATIVE EXAMPLES (1) 100 weight parts of epoxy resin (EPIKOTE-171), acrylonitrile butadiene copolymer rubber (Goodrich Co.'s). 0.2 weight parts of triphenyl sulphosphine as a modificating catalyst, 5 weight parts of dicyan-diamide and 0.2 weight parts of 2-heptadecyl imidazole were mixed each other and dissolved in dimethyl formamide solvent to form an adhesive having 200 cps in viscosity.

(2) This adhesive was coated on a glass-polyimido substrate as same as example 1, dried and cured at 180° C. for 1 hour to form an adhesive layer within the range of 30 to 40 μm in thickness.

(3) The surface of the adhesive layer provided at the substrate as same as example 1 made rough and then subjected electroless copper plating and electric copper plating thereto to prepare a circuit board.

The circuit board thus obtained had 1.9 kg/cm of peel strength of the substrate and the copper plating film. However, the surface resistance of the adhesive layer due to the boiling test changed from $2 \times 10^{13}$ Ωcm of initial value to $8 \times 10^{10}$ Ωcm and a blister was observed over the whole surface of copper plating film by the heat resistant test with said hot plate.

EXAMPLE 2

(1) The adhesive of example 1 was coated on an alumina ceramic substrate (purity 96%, size 50.8×50.8×1.0 mm) with a roller coater, dried and cured to form the adhesive layer within the range of 5 to 7 μm in thickness. The surface of the adhesive layer made rough as same as example 1 to be subjected the electroless copper plating having about 5 μm in plating film thickness thereto. Then, the copper plating film was etched using a photo-sensitive dry film (Du Pont Co., Inc.'s RISTON-1015) to form a conductor circuit having 50 μm in minimum conductor breadth.

(2) A photo-sensitive dry film (Du Pont Co., Inc.'s RISTON T-168) for additive was laminated on a ceramic substrate formed a conductor circuit thereon. After exposure and development, a hole having 100 μmφ as a via hole was perforated therein. Then, the hole of the dry film was filled with the electroless copper plating to about 25 μm in thickness to form a copper plating pillar for via hole having 100 μmφ. After that, the dry film was peeled.

(3) The adhesive of example 1 was coated several times on the ceramic substrate having the copper plating pillar for via hole using a spin coater to form an interlayer insulation film within the range of 25 to 32 μm in thickness. Then, the surface was grinded in parallel with a surface grinder, whereby the thickness of the interlayer insulation film and the copper plating pillar was made about 20 μm.

(4) The surface of the interlayer insulation film thus grinded in parallel was roughed with aqueous chromic acid as same as example 1 to be subjected the electroless copper plating thereto having 5 μm in plating film thickness. Thus, the copper plating film was etched using a photo-sensitive dry film to form a conductor circuit having 50 μm in minimum conductor breath.

(5) The above steps (2) to (4) were done repeatedly to prepare a Cu/ polyimido multi-layer circuit board having a high density suitable to set a LSI.

EXAMPLE 3

(1) 100 weight parts of epoxy resin (EPIKOATE-171), 110 weight parts of acid anhydride curing agent (Hitachi Chemical Co., Ltd.'s HN-2200) and 1 weight part of N,N-dimethyl-benzylamine (Tokyo Chemical Co., Ltd's) were mixed each other to prepare an epoxy resin solution.

(2) The epoxy resin fine powders described in Example 1 were added to the epoxy resin solution in the proportion of 80 weight parts to 100 weight parts of epoxy resin solids. The mixture was adjusted to 120 cps of viscosity while adding dimethyl formamide with a homodisperser and then kneaded with three rollers to prepare the adhesive.

(3) The adhesive was coated on the both surfaces of the heat resistant glass-epoxy substrate (Risho Kogyo Co., Ltd.'s CS-3525, size 100×100×1.5 mm) which was not pasted the copper foil with a roller coater, then dried and cured at 100° C. for 4 hours and then at 150° C. for 4 hours to form an adhesive layer within the range of 7 to 10 μm in thickness.

(4) A hole having 0.8 mmφ was perforated on the substrate formed the adhesive layer thereon with a NC multispindle driller, and then the substrate was immersed into the oxidizing agent comprising 800g/l of aqueous chromic acid ($CrO_3$) at 60° C. for 10 minutes to rough the surface of the adhesive layer and washed with water after neutralization.

(5) A palladium catalyst was provided on the substrate to activate the surface of the adhesive layer, and then the substrate was immersed into the electroless copper plating solution of Example 1 for 11 hours to be subjected the electroless copper plating having about 25 μm in plating film thickness thereto to prepare a both-sided through-hole circuit board.

The circuit board thus obtained had 1.3kg/cm of peel strength of the substrate and the electroless copper film. The change of the surface resistance due to the boiling test was $4 \times 10^{12}$ Ω.cm to $2 \times 10^{14}$ Ω.cm of the initial value. This change was very low, and any unusual change after the heat resistant test with a hot plate did not appear.

EXAMPLE 4

The ceramic circuit board was prepared by the following steps (1) to (5).

(1) 96% alumina ceramic substrate (outer size 50.8×50.8 mm, thickness 0.635 mm) was immersed into 2% solution wherein silane coupling agent (Shinetsu Chemical Company Inc.'s KBM-303) was dissolved in methyl ethyl ketone, and then dried to treat the surface of said ceramic substrate with coupling treatment.

(2) The heat resistant epoxy resin (Mitsui Chemical Co., Ltd.'s TA-1850) solids were mixed in the proportion of 100 weight parts to 150 weight parts of the fused silica fine particles (Tatsumori Co., Ltd.'s FUSELEX-X) having 1.5 μm in average particle size subjected to silane coupling treatment, adjusted the viscosity to 200 cps with a butyl carbitol solvent, and kneaded with three rollers. The varnish synthetic resin thus obtained was coated on one side surface of the ceramic substrate with a roller coater and then heatingly cured at 180° C. for 1 hour to form an adhesive layer having 5 μm in thickness as shown in FIG. 1(B).

(3) The surface of the adhesive layer was polished lightly using #1000 alumina fine powder abrasive with a rotary brush grinder to expose the fused silica fine particles on the surface of the adhesive layer as shown in FIG. 1(C). Further, the thickness of the adhesive layer after abrading was within the range of 3 to 4 μm.

(4) The abraded ceramic substrate was immersed into hydrofluoric acid solution having 25% of concentration for 2 minutes and washed with water roughing the surface of the adhesive layer as shown in FIG. 1(D).

(5) After masking one side surface of the ceramic substrate wherein the adhesive layer has not been yet formed, the surface of the adhesive layer was activated by providing the palladium catalyst (Shipley Co., Ltd.'s CATAPOSIT 44), and immersed into the electroless copper plating solution for additive method having a composition shown as follows for 3 hours to be subjected the electroless copper plating having 7 μm in thickness thereto as shown in FIG. 1 (E).

cupric sulfate ($CuSO_4$ $5H_2O$): 0.06 mol/l
formalin (37%): 0.3 mol/l
caustic soda (NaOH): 0.35 mol/l
EDTA: 0.12 mol/l
additive: a little
plating temperature: 70°–72° C. PH:12.4

The ceramic circuit board thus prepared was subjected to an electric plating in a cupric sulfate plating bath to make copper plating thickness to 35 μm. The measuring result of peel strength according to JIS-C6481 was within the range of 1.4 to 1.8kg/cm, which was high in adhesive strength and stable. Further, even after a high temperature standing test at 150° C. for 500 hours, a large decrease of the adhesive strength did not appear and an excellent heat resistance could be obtained. Furthermore, the result of the heat diffusion test by mounting a power transistor (2SC2233) was 1.12 C/W, which showed an excellent heat diffusion.

EXAMPLE 5

This Example is the same as Example 4, but the ceramic circuit board was prepared by changing the thickness of the adhesive layer to about 50 μm. The heat diffusion of the substrate was examined as same as Example 4. The result was 2.37° C./W. The heat diffusion was inferior to that examined by Example 4 somewhat.

EXAMPLE 6

Both-sided through-hole ceramic circuit board as shown in FIG. 2 was prepared by the same steps as Example 4 using a 96% alumina ceramic substrate (outer size 50.8×50.8 mm, thickness 0.635 mm) arranged a hole having 0.5 mmφ at a fixed portion as a ceramic substrate.

The ceramic circuit board thus obtained was excellent in reliability and heat resistance of the adhesiveness of the ceramic substrate and the electroless copper plating nearly as same as that of Example 4. Further, the connecting reliability of through-hole displayed a high reliability in heat shock test (MIL-STD-202E 107D, Cond B) without any occurence of accident even after 200 cycles.

As described above, according to the adhesive for electroless copper plating and the method of preparing a circuit board using this adhesive of the present invention, the heat resistance, electric characteristics and adhesiveness of the substrate and the electroless plating film are very excellent, and further the adhesive for electroless plating and the circuit board used this adhesive can be easily obtained without any complicated steps. It is utilized widely as a highly accurate printed circuit board hybrid IC circuit board, multi-layer circuit board incorporated LSI or the like from the viewpoint of the available field.

What is claimed is:

1. A method of preparation of a circuit board comprising steps of:
    preparing fine powders of cured heat resistant resin soluble in a predetermined solution;
    dispersing said fine powders in an uncured heat resistant resin solution sparingly soluble in said predetermined solution by curing treatment, thereby forming an adhesive for electroless plating;

coating said adhesive onto a substrate;

drying and curing said adhesive with the substrate; and roughing the surface of said adhesive layer to be subjected a electoless plating thereto by dissolving at least a part of said fine powders on the surface of said adhesive layer with contact treatment of said predetermined solution with said adhesive layer.

2. A method of preparation of a circuit board according to claim 1, wherein said predetermined solution is an oxidizing aqueous solution.

3. A method of preparation of a circuit board according to claim 1, wherein said cured heat resistant resin is at least one kind of resin selected from epoxy resin, polyester resin, and bis-maleimido-triazin resin.

4. A method of preparation of a circuit board according to claim 1, wherein said fine powders are less than 10 μm in average particle size.

5. A method of preparation a circuit board according to claim 1, wherein said heat resistant resin is at least one kind of resin selected from epoxy resin, epoxy modified polyimido resin, polyimido resin, phenol resin or triazin resin.

6. A method of preparation of a circuit board according to claim 1, wherein said electroless plating is any one selected from an electroless copper plating, an electroless nickel plating, an electroless tin plating, an electroless gold plating or an electroless silver plating.

* * * * *